(12) United States Patent
Guo et al.

(10) Patent No.: US 12,317,503 B2
(45) Date of Patent: May 27, 2025

(54) MEMORY DEVICE, AND MANUFACTURING METHOD AND DRIVING METHOD THEREOF

(71) Applicant: CHANGXIN MEMORY TECHNOLOGIES, INC., Hefei (CN)

(72) Inventors: Shuai Guo, Hefei (CN); Mingguang Zuo, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 609 days.

(21) Appl. No.: 17/661,369

(22) Filed: Apr. 29, 2022

(65) Prior Publication Data

US 2023/0232635 A1 Jul. 20, 2023

Related U.S. Application Data

(63) Continuation of application No. PCT/CN2022/078211, filed on Feb. 28, 2022.

(30) Foreign Application Priority Data

Jan. 18, 2022 (CN) .......................... 202210054173.6

(51) Int. Cl.
  *H10B 51/20* (2023.01)
(52) U.S. Cl.
  CPC ................... *H10B 51/20* (2023.02)
(58) Field of Classification Search
  CPC . G11C 11/005; G11C 11/223; G11C 11/2273; G11C 11/2275; G11C 16/0425;
  (Continued)

(56) References Cited

U.S. PATENT DOCUMENTS 10,079,247 B2 * 9/2018 Kim ................... H10D 30/0415
10,763,273 B2 9/2020 Wu et al.
(Continued)

FOREIGN PATENT DOCUMENTS

CN 109686740 A 4/2019
CN 109698201 A 4/2019
(Continued)

OTHER PUBLICATIONS

International Search Report cited in PCT/CN2022/078211 mailed Oct. 10, 2022, 9 pages.

*Primary Examiner* — Telly D Green
(74) *Attorney, Agent, or Firm* — Syncoda LLC; Feng Ma

(57) ABSTRACT

The present disclosure relates to the technical field of semiconductor manufacturing, and in particular, to a memory device, and a manufacturing method and a driving method thereof. The memory device includes: a substrate; a stacked structure, where the stacked structure includes a first gate layer, a second gate layer, and interlayer isolation layers, one of the interlayer isolation layers is located between the first gate layer and the second gate layer, and another one of the interlayer isolation layers is located between the first gate layer and the substrate; and a memory structure, including a through hole penetrating the stacked structure, and a trench structure filled in the through hole. The present disclosure enables the memory device to be used as nonvolatile memory with different storage modes, thereby realizing versatility of the memory device.

13 Claims, 14 Drawing Sheets

(58) Field of Classification Search
CPC ......... G11C 16/10; G11C 16/14; G11C 16/26; H10B 43/27; H10B 51/20; H10D 30/693; H10D 30/701; H10D 64/033; H10D 64/037; H10D 64/689
See application file for complete search history.

(56) References Cited

U.S. PATENT DOCUMENTS

| | | | | |
|---|---|---|---|---|
| 11,158,622 | B1* | 10/2021 | Zhang | H01L 25/50 |
| 2008/0230830 | A1* | 9/2008 | Kim | H10D 30/69 |
| | | | | 257/E21.546 |
| 2016/0086970 | A1* | 3/2016 | Peng | H10B 43/10 |
| | | | | 257/324 |
| 2016/0148947 | A1* | 5/2016 | Seo | H10B 43/27 |
| | | | | 257/324 |
| 2018/0130823 | A1* | 5/2018 | Kim | H10D 30/0415 |
| 2021/0028282 | A1* | 1/2021 | Kumar | H10D 30/63 |
| 2021/0035990 | A1 | 2/2021 | Lee et al. | |
| 2021/0098487 | A1* | 4/2021 | Wang | C23C 28/04 |
| 2021/0135010 | A1 | 5/2021 | Yamazaki et al. | |
| 2021/0175253 | A1 | 6/2021 | Han et al. | |
| 2021/0210342 | A1* | 7/2021 | Lee | H01L 21/02488 |
| 2021/0280428 | A1* | 9/2021 | Zhang | H01L 21/68771 |
| 2021/0358948 | A1* | 11/2021 | Wang | C23C 28/42 |
| 2021/0375937 | A1* | 12/2021 | Wu | H10D 64/693 |
| 2021/0384258 | A1* | 12/2021 | Hwang | H10D 99/00 |

FOREIGN PATENT DOCUMENTS

| | | | | |
|---|---|---|---|---|
| CN | 110364573 | A | | 10/2019 |
| CN | 110676260 | A * | | 1/2020 |
| CN | 110896078 | A | | 3/2020 |
| CN | 112071850 | A * | 12/2020 | ............ H10B 43/10 |
| CN | 112802854 | A | | 5/2021 |
| CN | 112820735 | A | | 5/2021 |
| CN | 112820736 | A | | 5/2021 |
| CN | 113725227 | A | | 11/2021 |

* cited by examiner

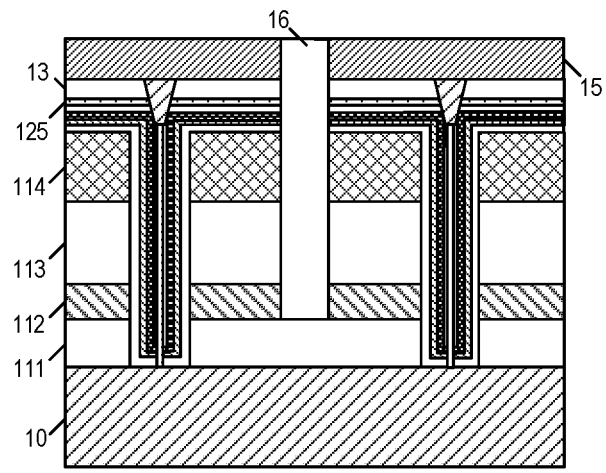

FIG. 7P

In a first storage mode, apply a first turn-on voltage to the second gate layer and apply a first storage voltage to the first gate layer, to write information into the ferroelectric layer — S91

In a second storage mode, apply a second turn-on voltage to the second gate layer and apply a second storage voltage to the first gate layer, to write information into the charge capture layer — S92

FIG. 8

MEMORY DEVICE, AND MANUFACTURING METHOD AND DRIVING METHOD THEREOF

CROSS-REFERENCE TO RELATED APPLICATIONS

This is a continuation of International Patent Application No. PCT/CN2022/078211, filed on Feb. 28, 2022, which claims the priority to Chinese Patent Application No. 202210054173.6, titled "MEMORY DEVICE, AND MANUFACTURING METHOD AND DRIVING METHOD THEREOF" and filed on Jan. 18, 2022. The entire contents of International Patent Application No. PCT/CN2022/078211 and Chinese Patent Application No. 202210054173.6 are incorporated herein by reference.

TECHNICAL FIELD

The present disclosure relates to the technical field of semiconductor manufacturing, and in particular, to a memory device, and a manufacturing method and a driving method thereof.

BACKGROUND

As a semiconductor device commonly used in an electronic device such as a computer, a dynamic random access memory (DRAM) includes a plurality of memory cells, and each of the memory cells usually includes a transistor and a capacitor. The transistor has a gate electrically connected to a word line, a source electrically connected to a bit line, and a drain electrically connected to the capacitor. A word line voltage on the word line can control on and off of the transistor, such that data information stored in the capacitor can be read through the bit line or data information can be written into the capacitor through the bit line.

However, with the rapid development of the semiconductor industry, semiconductor enterprises want to maximize benefits, and consumers expect to realize multi-function semiconductor products. However, existing memory devices have single functions due to limitations on their structures.

Therefore, how to realize a function of a memory device to expand an application field of the memory device is an urgent technical problem to be resolved.

SUMMARY

According to some embodiments, the present disclosure provides a memory device, including:
 a substrate;
 a stacked structure, where the stacked structure includes a first gate layer, a second gate layer, and interlayer isolation layers, one of the interlayer isolation layers is located between the first gate layer and the second gate layer, and another one of the interlayer isolation layers is located between the first gate layer and the substrate; and
 a memory structure, including a through hole penetrating through the stacked structure, and a trench structure filled in the through hole.

According to some other embodiments, the present disclosure further provides a manufacturing method of a memory device, including the following steps:
 providing a substrate;
 forming a stacked layer, where the stacked layer includes a first interlayer isolation layer, a sacrificial layer, a second interlayer isolation layer, and a second gate layer that are successively stacked on the substrate;
 etching the stacked layer to form a through hole penetrating through the stacked layer;
 forming a trench structure in the through hole; and
 removing the sacrificial layer and replacing the sacrificial layer with a conductive material to form a first gate layer.

According to some other embodiments, the present disclosure further provides a driving method of the memory device described above, including the following steps:
 in a first storage mode, applying a first turn-on voltage to the second gate layer and applying a first storage voltage to the first gate layer, to write information into the ferroelectric layer; and
 in a second storage mode, applying a second turn-on voltage to the second gate layer and applying a second storage voltage to the first gate layer, to write information into the charge capture layer.

BRIEF DESCRIPTION OF THE DRAWINGS

FIG. 8 is a flowchart of a driving method of a memory device according to a specific implementation of the present disclosure.

DETAILED DESCRIPTION

Specific implementations of a memory device, and a manufacturing method and a driving method thereof provided in the present disclosure will be described below in detail with reference to the accompanying drawings.

Figure 1A:
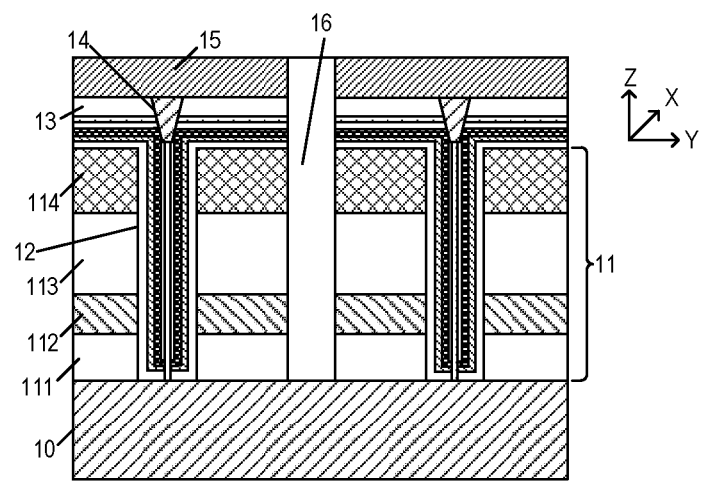
FIG. 1A is a schematic cross-sectional view of a memory device according to a specific implementation of the present disclosure.
Figure 1B:
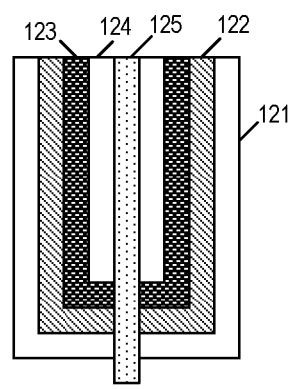
FIG. 1B is a schematic cross-sectional view of a trench structure according to a specific implementation of the present disclosure.
Figure 2:
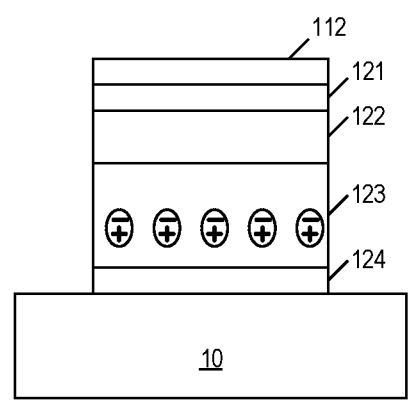
FIG. 2 is a schematic principle diagram when a memory device is used as a ferroelectric memory according to a specific implementation of the present disclosure.
Figure 3:
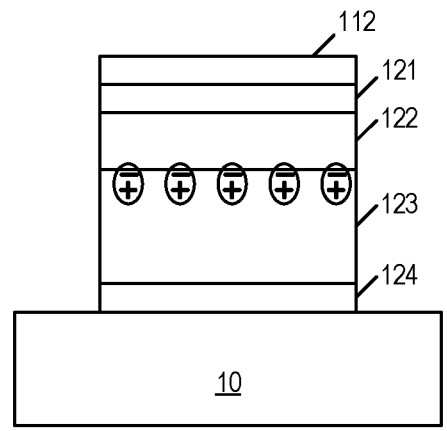
FIG. 3 is a schematic principle diagram when a memory device is used as a flash memory according to a specific implementation of the present disclosure.
Figure 4:
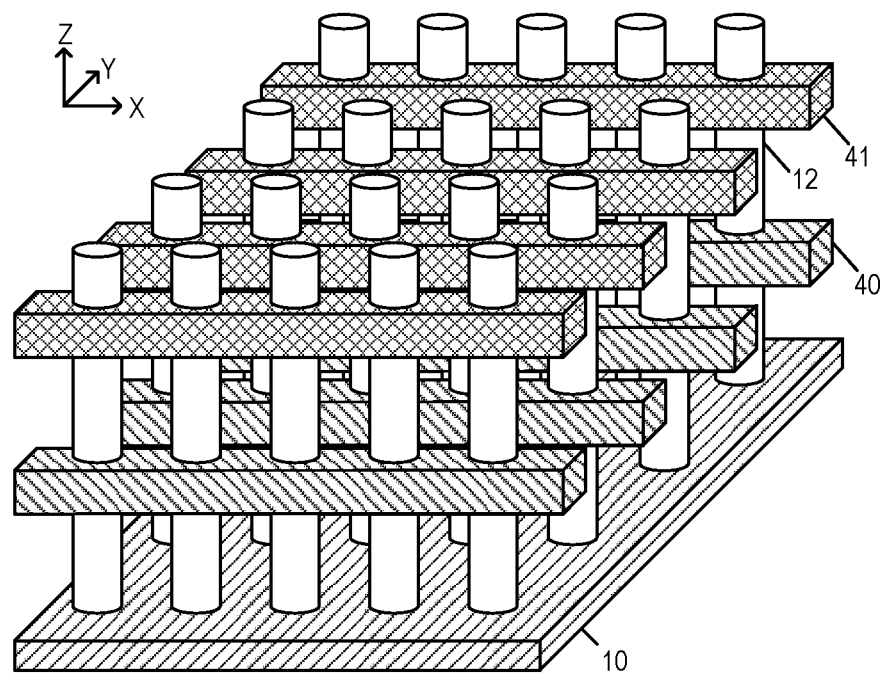
FIG. 4 is a schematic diagram of a three-dimensional structure of a memory device according to a specific implementation of the present disclosure.

The specific implementations of the present disclosure provide a memory device. FIG. 1A is a schematic cross-sectional view of the memory device according to a specific implementation of the present disclosure. FIG. 1B is a schematic cross-sectional view of a trench structure according to a specific implementation of the present disclosure. FIG. 2 is a schematic principle diagram when the memory device is used as a ferroelectric memory according to a specific implementation of the present disclosure. FIG. 3 is a schematic principle diagram when the memory device is used as a flash memory according to a specific implementation of the present disclosure. FIG. 4 is a schematic diagram of a three-dimensional structure of the memory device according to a specific implementation of the present disclosure. As shown in FIG. 1A, FIG. 1B, and FIG. 2 to FIG. 4, the memory device includes:

a substrate 10;

a stacked structure 11, where the stacked structure 11 includes a first gate layer 112, a second gate layer 114, and interlayer isolation layers, one of the interlayer isolation layers is located between the first gate layer 112 and the second gate layer 114, and another one of the interlayer isolation layers is located between the first gate layer 112 and the substrate 10; and a memory structure 12, including a through hole penetrating through the stacked structure 11, and a trench structure filled in the through hole.

Specifically, the substrate 10 may be but not limited to a silicon substrate. This specific implementation is described by taking the substrate as the silicon substrate for example. In other embodiments, the substrate 10 may alternatively be a semiconductor substrate such as a gallium nitride substrate, a gallium arsenide substrate, a gallium carbide substrate, a silicon carbide substrate or a silicon-on-insulator (SOI) substrate. The interlayer isolation layer includes a first interlayer isolation layer 111 between the first gate layer 112 and the substrate 10, and a second interlayer isolation layer 113 between the first gate layer 112 and the second gate layer 114. A top surface of the through hole is flush with a top surface of the stacked structure 11 (namely, a top surface of the second gate layer 114 in the stacked structure 11). When the memory device is used to store information, the trench structure connected to the first gate layer 112 can be turned on by applying a turn-on voltage to the second gate layer 114. Then, the information is written by applying a storage voltage to the first gate layer 112. The information can be stored in different regions of the trench structure by adjusting the storage voltage applied to the first gate layer 112. In this way, the memory device can be used as a ferroelectric memory (such as an FeRAM) or a flash memory (such as an NAND), in other words, the memory device can work in two different storage modes, so as to realize versatility of the memory device and expand an application field of the memory device.

In some embodiments, the trench structure includes a tunneling layer 121 covering an inner wall of the through hole, a charge capture layer 122 covering a surface of the tunneling layer 121, a ferroelectric layer 123 covering a surface of the charge capture layer 122, a buffer layer 124 covering a surface of the ferroelectric layer 123, and a channel layer 125 covering a surface of the buffer layer 124.

Specifically, the tunneling layer 121, the charge capture layer 122, the ferroelectric layer 123, the buffer layer 124, and the channel layer 125 are successively stacked along a direction in which the inner wall of the through hole points to a center of the through hole. The material of the tunneling layer 121 may be an oxide material, for example, silicon dioxide. The material of the charge capture layer 122 may be a silicon oxynitride material, a silicon nitride material, a silicon oxide composite material, or a high-K dielectric composite material. In an embodiment, the material of the charge capture layer 122 is a zinc silicon oxide (ZSO) material. The material of the ferroelectric layer 123 may be a hafnium oxide material, a zirconium oxide material, a lead zirconate titanate material, or a hafnium zirconium oxide (HZO) material. In an embodiment, the material of the ferroelectric layer 123 is a hafnium zirconium oxide material. The material of the buffer layer 124 may be the oxide material, for example, silicon dioxide. The material of the channel layer 125 may be a polycrystalline silicon material, a silicon germanium (SiGe) material, or an indium gallium zinc oxide (IGZO) material. In an embodiment, the material of the channel layer 125 is the polycrystalline silicon material.

As shown in FIG. 2, when the memory device provided in this specific implementation is used as a nonvolatile memory such as the FeRAM, during a write operation, after a first turn-on voltage is applied to the second gate layer 114, a first storage voltage is applied to the first gate layer 112 to polarize the ferroelectric layer 123. After the polarization, a charge is generated on the surface of the ferroelectric layer 123, so as to write the information. During a read operation, a turn-on voltage of the trench structure where the ferroelectric layer 123 is polarized decreases. In this case, a first reading voltage is applied to the first gate layer 112, such that an S/D circuit corresponding to the trench structure is turned on and a number 1 is read. For the trench structure where the ferroelectric layer 123 is not polarized, the first reading voltage is applied to the first gate layer 112, such that the S/D circuit corresponding to the trench structure is turned off and a number 0 is read. During an erasing operation, a first erasing voltage is applied to the first gate layer 112 to perform depolarization by using a measured ferroelectric hysteresis loop of the ferroelectric layer 123, so as to erase the information stored in the memory device. The substrate 10 in FIG. 2 further includes a source region 101 and a drain region 102.

As shown in FIG. 3, when the memory device provided in this specific implementation is used as the nonvolatile memory such as the NAND, during the write operation, after a second turn-on voltage is applied to the second gate layer 114, a second storage voltage greater than the first storage voltage is applied to the first gate layer 112, such that an electron or a hole enters the charge capture layer 122 after passing through the tunneling layer 121 and are stored in the charge capture layer 122. The electron stored in the charge capture layer 122 enables the polarization of the ferroelectric layer 123 to be preserved for a long time, so as to realize a nonvolatile storage function of the memory device. During the read operation, the turn-on voltage of the trench structure where the ferroelectric layer 123 is polarized decreases. In this case, a second reading voltage is applied to the first gate layer 112, such that the S/D circuit corresponding to the trench structure is turned on and the number 1 is read. For the trench structure where the ferroelectric layer 123 is not polarized, the second reading voltage is applied to the first gate layer 112, such that the S/D circuit corresponding to the trench structure is turned off and the number 0 is read. During the erasing operation, a second erasing voltage is applied to the first gate layer 112 to perform depolarization by using the measured ferroelectric hysteresis loop of the ferroelectric layer 123 so as to erase the information stored in the memory device. The substrate 10 in FIG. 2 further includes a source region 101 and a drain region 102.

In some embodiments, the channel layer 125 penetrates through the tunneling layer 121, the charge capture layer 122, the ferroelectric layer 123, and the buffer layer 124, which are at the bottom of the through hole; and a bottom surface of the channel layer 125 comes into contact with the substrate 10; and the memory device further includes:

a drain 14, where the drain 14 is connected to a top surface of the channel layer 125 in a contact manner.

In some embodiments, the trench structure further covers the top surface of the stacked structure 11; and the drain 14 penetrates through the trench structure located on the top surface of the stacked structure 11.

Specifically, the bottom surface of the channel layer 125 is connected to the source region inside the substrate 10 in the contact manner, and the top surface of the channel layer 125 is connected to the drain 14 in the contact manner. The memory device further includes a first coating layer 13 covering the trench structure on the top surface of the stacked structure 11 to avoid damage caused by a subsequent process to the trench structure, especially the channel layer 125 in the trench structure. The drain 14 passes through, along a direction perpendicular to a top surface of the substrate 10 (for example, a Z-axis direction in FIG. 1A), the first coating layer 13 and the trench structure on the top surface of the stacked structure 11, so as to facilitate subsequent lead-out of a contact point of the drain 14. The memory device further includes a second coating layer 15 that covers the first coating layer 13 and the drain 14. The material of the first coating layer 13 may be the oxide material (such as silicon dioxide), and the material of the second coating layer 15 may be a nitride material (such as silicon nitride).

In some embodiments, a plurality of memory structures 12 are arranged in an array along a first direction and a second direction, to increase storage density of the memory device.

In some embodiments, the first gate layer 112 includes a plurality of first gate structures 40 that are parallel spaced along the second direction, the second gate layer 114 includes a plurality of second gate structures 41 that are parallel spaced along the second direction, the plurality of second gate structures 41 are located above the plurality of first gate structures 40; and a plurality of memory structures 12, that are arranged in parallel along the first direction share the plurality of first gate structures 40 and the plurality of second gate structures 41.

In some embodiments, the memory device further includes:

a separation structure 16, where the separation structure 16 penetrates through the stacked structure 11 along the direction perpendicular to the top surface of the substrate 10 and is located between two adjacent ones of the plurality of first gate structures 40 and between two adjacent ones of the plurality of second gate structures 41.

The following provides description by using an example in which an X-axis direction in FIG. 4 is the first direction and a Y-axis direction in FIG. 4 is the second direction, the X-axis direction is perpendicular to the Y-axis direction, and a Z-axis direction is perpendicular to the Y-axis direction. For example, as shown in FIG. 1A and FIG. 4, the memory device includes a plurality of memory structures 12 that are arranged in a two-dimensional array along the X-axis direction and the Y-axis direction. The separation structure 16 penetrates through the stacked structure 11 along the Z-axis direction. Each separation structure 16 extends along the X-axis direction, and a plurality of separation structures 16 are arranged in parallel along the Y-axis direction to separate the first gate layer 112 into the plurality of first gate structures 40 that are parallel spaced along the Y-axis direction and the second gate layer 114 into the plurality of second gate structures 41 that are parallel spaced along the Y-axis direction. Each of the plurality of first gate structures 40 and each of the plurality of second gate structures 41 extend along the X-axis direction. The material of the separation structure 16 is an insulating material such as silicon dioxide, to electrically isolate two adjacent ones of the plurality of first gate structures 40 and two adjacent ones of the plurality of second gate structures 41.

In some embodiments, the material of the first gate structure 40 is a metallic material, and the material of the second gate structure 41 is the polycrystalline silicon material.

For example, the first gate structure 40 may be made of, but not limited to, tungsten. One of the plurality of second gate structures 41 is configured to turn on all of the plurality of memory structures 12 arranged along the first direction. Since the second gate structure 41 is closer to a top metal layer of the memory device than the first gate structure 40, a turn-on voltage of the second gate structure 41 is greatly different from that of the first gate structure 40 due to impact of an electric field of the top metal layer. Therefore, the material of the first gate structure 40 and the material of the second gate structure 41 are different, so as to apply different voltages to the first gate structure 40 and the second gate structure 41. The top metal layer is a metal layer for transmitting a control signal from the outside to the memory structure 12.

Figure 5:
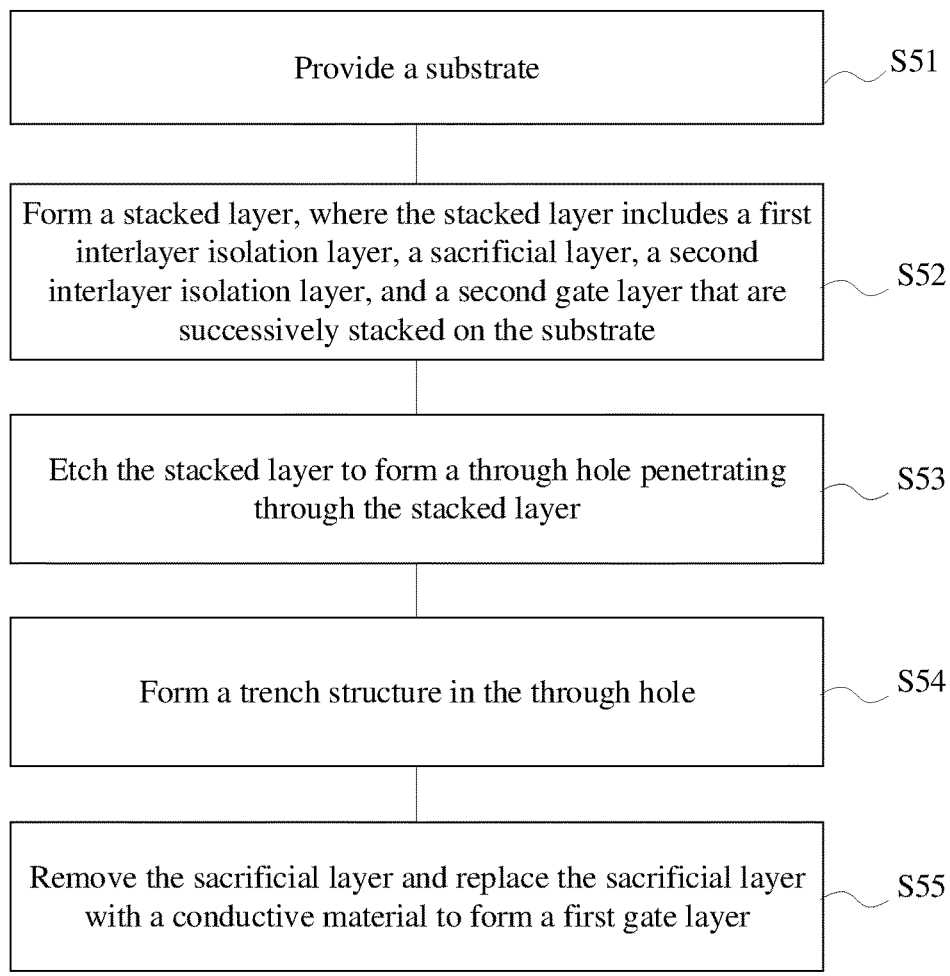
FIG. 5 is a flowchart of a manufacturing method of a memory device according to a specific implementation of the present disclosure.
Figure 6A:
FIG. 6A to FIG. 6P are schematic cross-sectional views of main processing steps along a first direction during manufacturing of a memory device according to a specific implementation of the present disclosure.
Figure 6B:
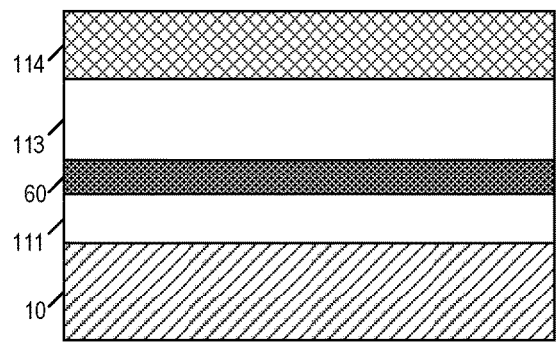
Figure 6C:
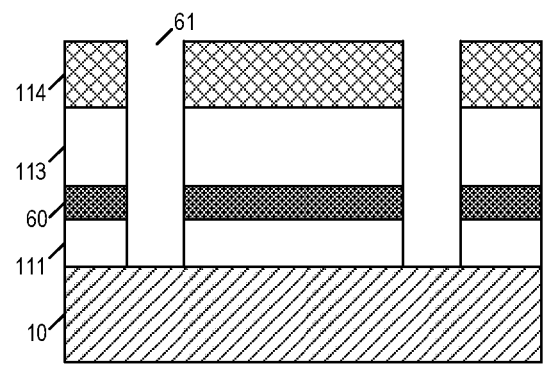
Figure 6P:
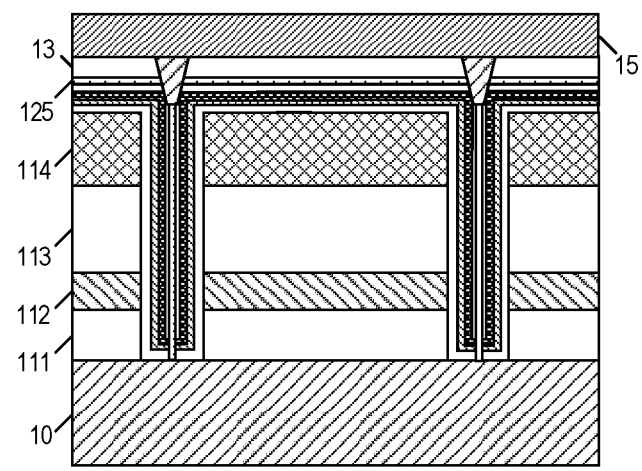
Figure 7A:
FIG. 7A to FIG. 7P are schematic cross-sectional views of main processing steps along a second direction during manufacturing of a memory device according to a specific implementation of the present disclosure.

According to some other embodiments, the specific implementations further provide a manufacturing method of a memory device. FIG. 5 is a flowchart of a manufacturing method of a memory device according to a specific implementation of the present disclosure. FIG. 6A to FIG. 6P are schematic cross-sectional views of main processing steps along a first direction during manufacturing of the memory device according to a specific implementation of the present disclosure. FIG. 7A to FIG. 7P are schematic cross-sectional views of main processing steps along a second direction during manufacturing of the memory device according to a specific implementation of the present disclosure. For schematic structural diagrams of a memory device manufactured in this specific implementation, reference may be made to FIG. 1A, FIG. 1B, and FIG. 2 to FIG. 4. As shown in FIG. 4, FIG. 5, FIG. 6A to 6P, and FIG. 7A to FIG. 7P, the manufacturing method of a memory device includes the following steps:

Step S51: Provide a substrate 10, as shown in FIG. 6A and FIG. 7A.

Figure 7B:
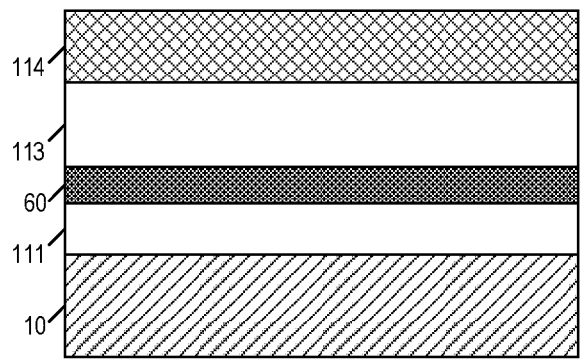

Step S52: Form a stacked layer, where the stacked layer includes a first interlayer isolation layer 111, a sacrificial layer 60, a second interlayer isolation layer 113, and a second gate layer 114 that are successively stacked on the substrate 10, as shown in FIG. 6B and FIG. 7B.

Specifically, the substrate 10 may be but not limited to a silicon substrate. This specific implementation is described by taking the substrate as the silicon substrate for example. In other embodiments, the substrate 10 may alternatively be a semiconductor substrate such as a gallium nitride substrate, a gallium arsenide substrate, a gallium carbide substrate, a silicon carbide substrate or an SOI substrate. There should be a large etch selectivity of the sacrificial layer 60 to the first interlayer isolation layer 111 and a large etch selectivity of the sacrificial layer 60 to the second interlayer isolation layer 113 to facilitate subsequent selective removal of the sacrificial layer 60. In an example, both the etch selectivity of the sacrificial layer 60 to the first interlayer isolation layer 111 and the etch selectivity of the sacrificial layer 60 to the second interlayer isolation layer 113 are greater than 3. In an embodiment, the materials of the first interlayer isolation layer 111 and the second interlayer isolation layer 113 may be oxide materials (for example, silicon dioxide), and the material of the sacrificial layer 60 may be a nitride material (for example, silicon nitride). The material of the second gate layer 114 may be a polycrystalline silicon material.

Figure 7C:
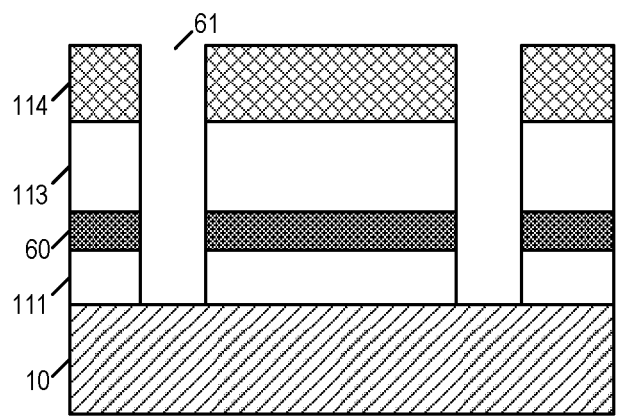

Step S53: Etch the stacked layer to form a through hole 61 penetrating through the stacked layer, as shown in FIG. 6C and FIG. 7C.

In some embodiments, the forming a through hole 61 penetrating through the stacked layer specifically includes:
  etching the stacked layer to form a plurality of through holes 61 each penetrating through the stacked layer, wherein the plurality of through holes 61 are arranged in an array along a first direction and a second direction, where the first direction and the second direction are parallel to a top surface of the substrate 10, and the first direction intersects with the second direction.

Specifically, the stacked layer can be etched through dry etching along a direction perpendicular to the top surface of the substrate 10 to form the plurality of through holes 61 arranged in a two-dimensional array along the first direction and the second direction, and each of the plurality of through holes 61 penetrates through the stacked layer along the direction perpendicular to the top surface of the substrate 10. The first direction and the second direction may be intersected vertically or obliquely. This specific implementation is described by taking vertical intersection of the first direction and the second direction as an example.

Step S54: Form a trench structure in the through hole 61, as shown in FIG. 6I and FIG. 7I.

In some embodiments, the trench structure may include a tunneling layer 121 covering an inner wall of the through hole, a charge capture layer 122 covering a surface of the tunneling layer 121, a ferroelectric layer 123 covering a surface of the charge capture layer 122, a buffer layer 124 covering a surface of the ferroelectric layer 123, and a channel layer 125 covering a surface of the buffer layer 124.

Figure 6D:
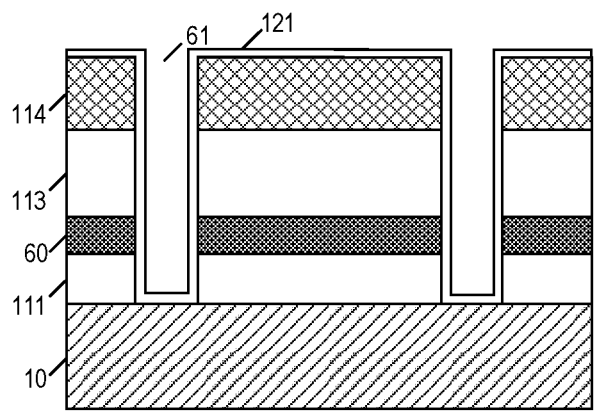
Figure 6E:
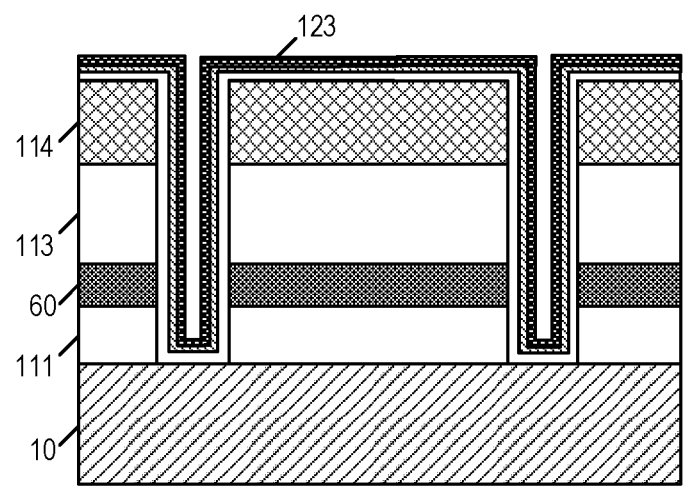
Figure 6F:
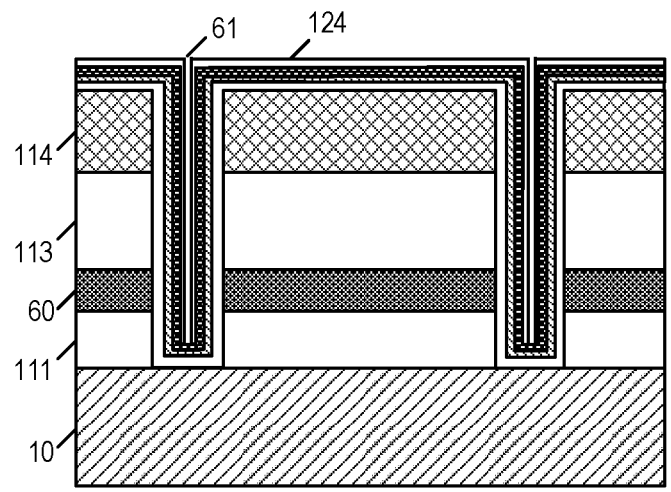
Figure 6G:
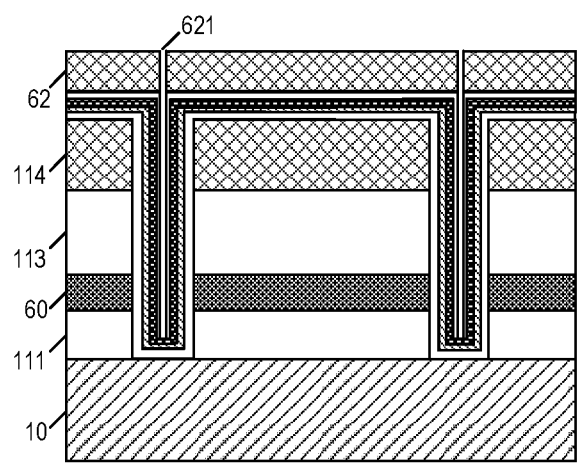
Figure 6H:
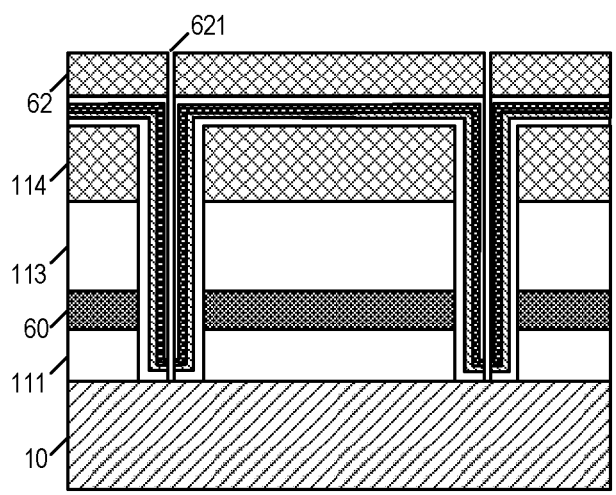
Figure 6I:
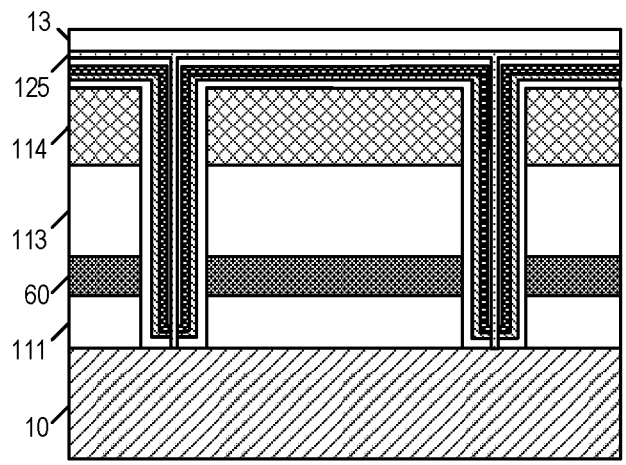
Figure 7D:
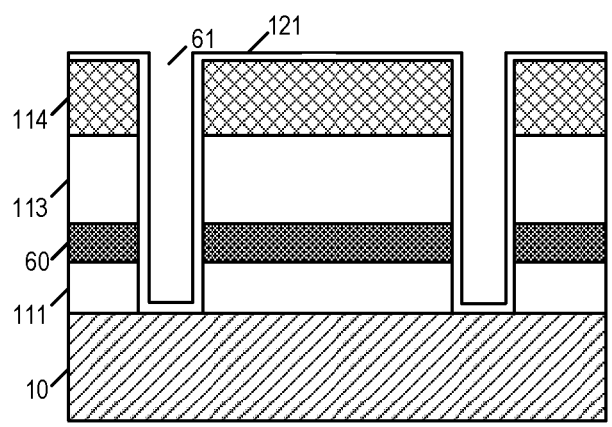
Figure 7E:
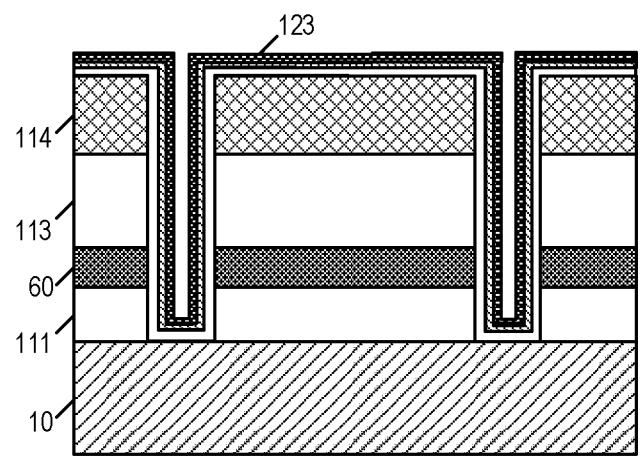
Figure 7F:
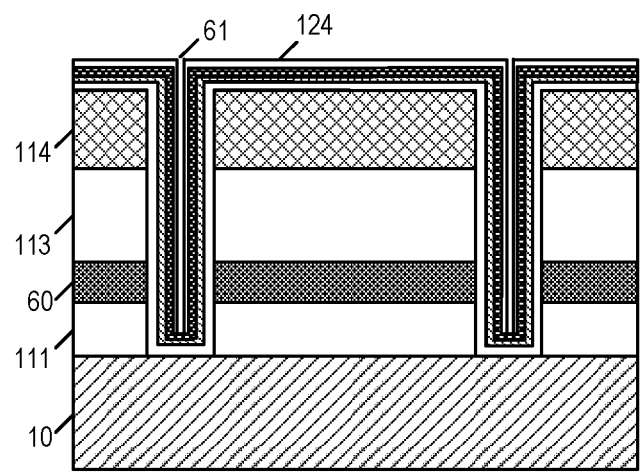
Figure 7G:
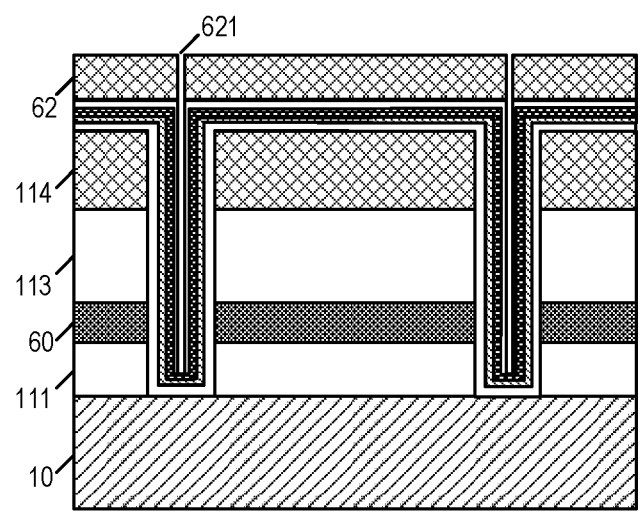
Figure 7H:
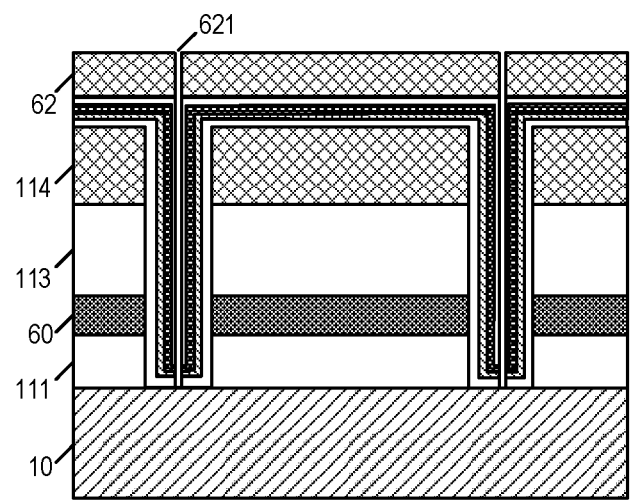
Figure 7I:
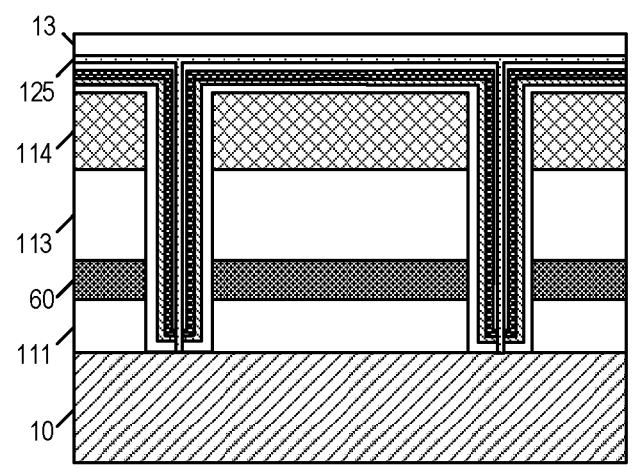

In some embodiments, the forming a trench structure in the through hole 61 specifically includes:
  forming the tunneling layer 121 on the inner wall of the through hole 61 and a top surface of the stacked layer, as shown in FIG. 6D and FIG. 7D;
  forming the charge capture layer 122 on the surface of the tunneling layer 121;
  forming the ferroelectric layer 123 on the surface of the charge capture layer 122, as shown in FIG. 6E and FIG. 7E;
  forming the buffer layer 124 on the surface of the ferroelectric layer 123, as shown in FIG. 6F and FIG. 7F; and
  forming the channel layer 125 on the surface of the buffer layer 124, as shown in FIG. 6I and FIG. 7I.

In some embodiments, the forming the channel layer 125 on the surface of the buffer layer 124 specifically includes:
  etching the buffer layer 124, the ferroelectric layer 123, the charge capture layer 122, and the tunneling layer 121, which are at the bottom of the through hole 61, to form a penetrating hole exposing the substrate 10, as shown in FIG. 6H and FIG. 7H; and
  forming the channel layer 125 that fills up the penetrating hole and covers the surface of the buffer layer 124, as shown in FIG. 6I and FIG. 7I.

Specifically, after the through hole 61 is formed, the tunneling layer 121, the charge capture layer 122, the ferroelectric layer 123, and the buffer layer 124 are successively deposited on the inner wall of the through hole 61 to form structures shown in FIG. 6F and FIG. 7F. Next, a patterned first mask layer 62 is formed on the buffer layer 124 on the top surface of the stacked layer, and the first mask layer 62 has a first etching hole 621 exposing the through hole 61, as shown in FIG. 6G and FIG. 7G. After that, the buffer layer 124, the ferroelectric layer 123, the charge capture layer 122, and the tunneling layer 121, which are at the bottom of the through hole 61, are etched along the first etching hole 621 to form the penetrating hole exposing the substrate 10, as shown in FIG. 6H and FIG. 7H. The first mask layer 62 is removed, and structures shown in FIG. 6I and FIG. 7I are obtained by forming the channel layer 125 that fills up the penetrating hole and covers the surface of the buffer layer 124 and forming a first coating layer 13 covering the channel layer 125 on the top surface of the stacked layer. The material of the tunneling layer 121 may be an oxide material, for example, silicon dioxide. The material of the charge capture layer 122 may be a silicon oxynitride material, a silicon nitride material, a silicon oxide composite material, or a high-K dielectric composite material. In an embodiment, the material of the charge capture layer 122 is a ZSO material. The material of the ferroelectric layer 123 may be a hafnium oxide material, a zirconium oxide material, a lead zirconate titanate material, or an HZO material. In an embodiment, the material of the ferroelectric layer 123 is a hafnium zirconium oxide material. The material of the buffer layer 124 may be the oxide material, for example, silicon dioxide. The material of the channel layer 125 may be the polycrystalline silicon material, a SiGe material, or an IGZO material. In an embodiment, the material of the channel layer 125 is the polycrystalline silicon material. The material of the first coating layer 13 is an insulating material, for example, silicon dioxide.

Figure 6J:
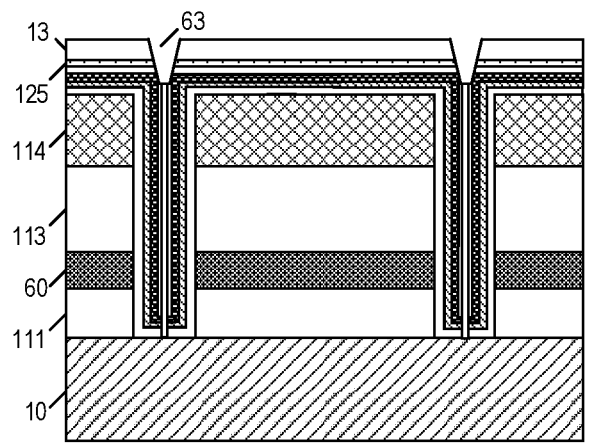
Figure 6K:
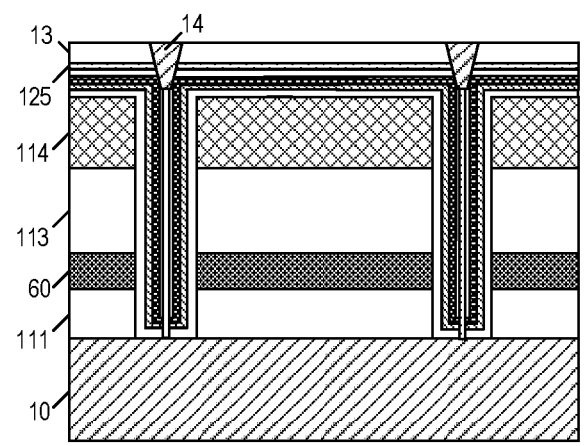
Figure 6L:
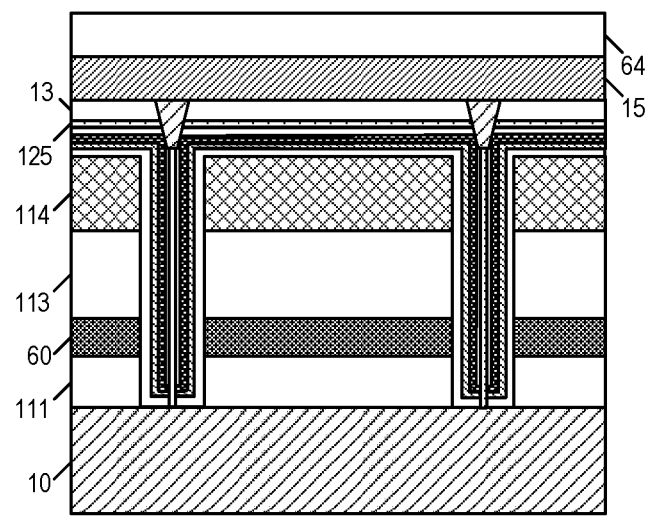
Figure 7J:
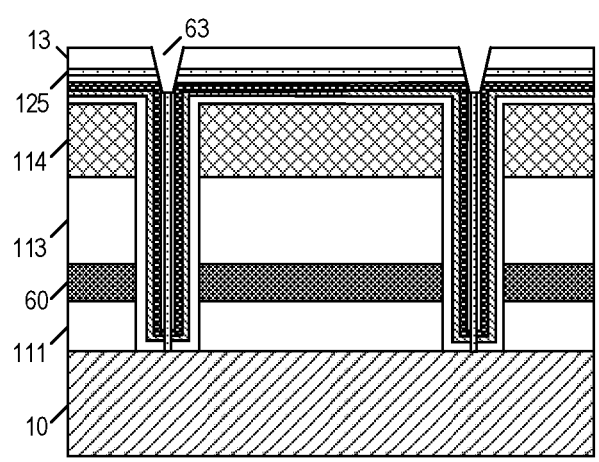
Figure 7K:
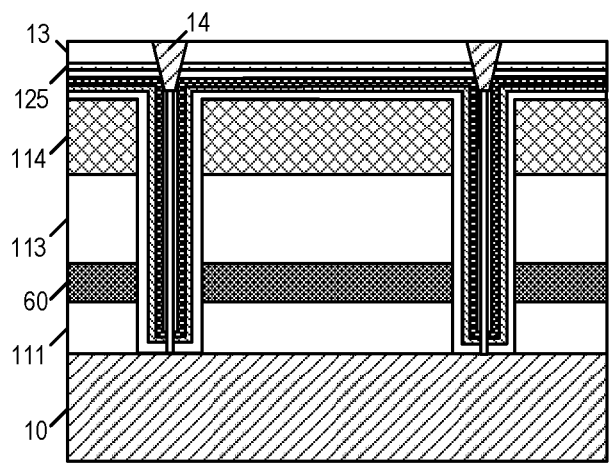

In some embodiments, the manufacturing method of a memory device further includes:
  etching at least a part of the trench structure on the top surface of the stacked layer to form a drain hole 63 exposing the channel layer 125 in the through hole 61, as shown in FIG. 6J and FIG. 7J; and
  filling the drain hole 63 to form a drain 14, as shown in FIG. 6K and FIG. 7K.

Specifically, the first coating layer 13 and the part of the trench structure can be etched through dry etching to form the drain hole 63 exposing the channel layer 125 in the through hole 61, as shown in FIG. 6J and FIG. 7J. After that, a conductive material such as tungsten is deposited in the drain hole 63 to form the drain 14, as shown in FIG. 6K and FIG. 7K.

Step S55: Remove the sacrificial layer 60 and replace the sacrificial layer 60 with the conductive material to form a first gate layer 112, as shown in FIG. 6N and FIG. 7N.

Figure 6M:
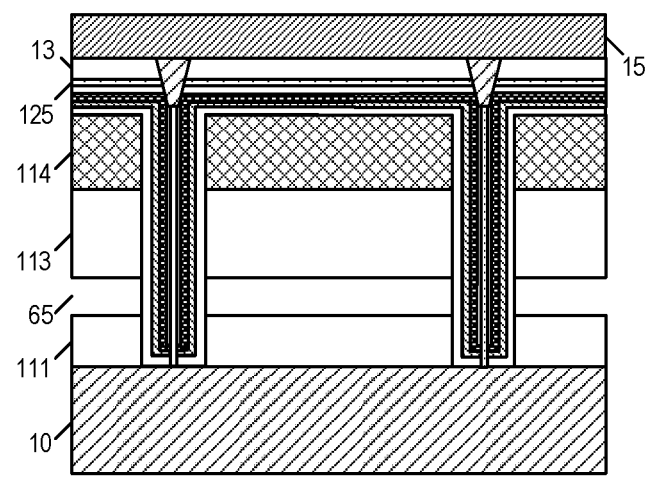
Figure 6N:
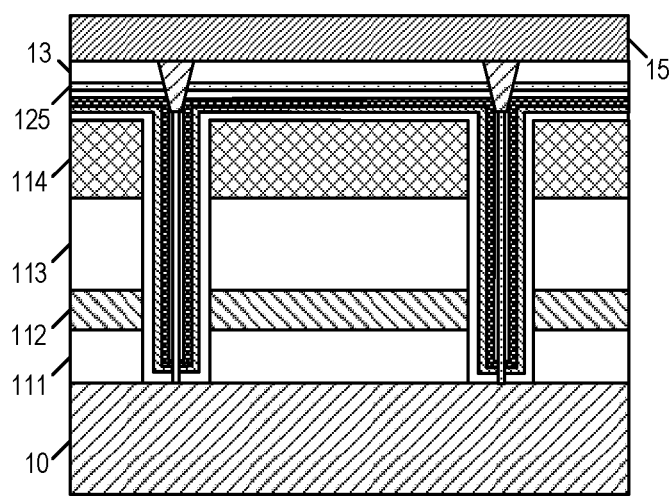
Figure 7L:
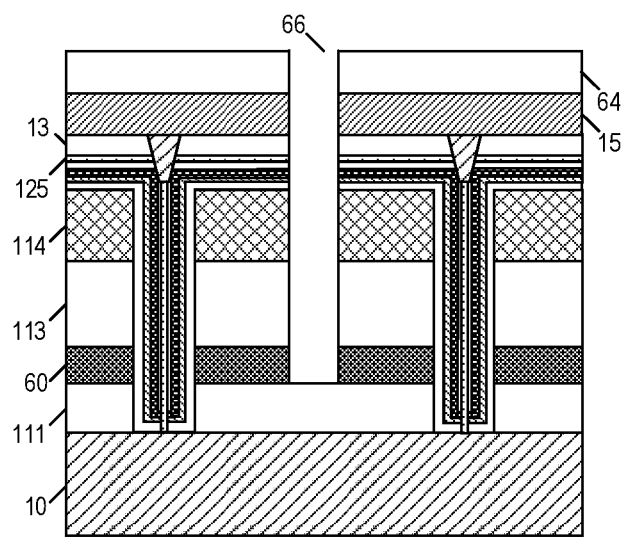
Figure 7M:
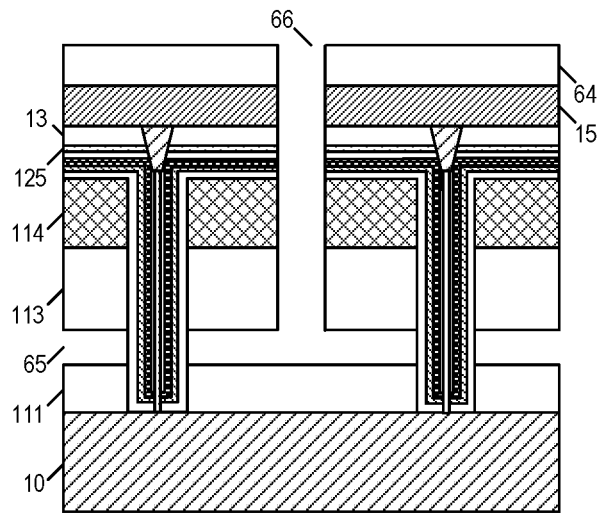
Figure 7N:
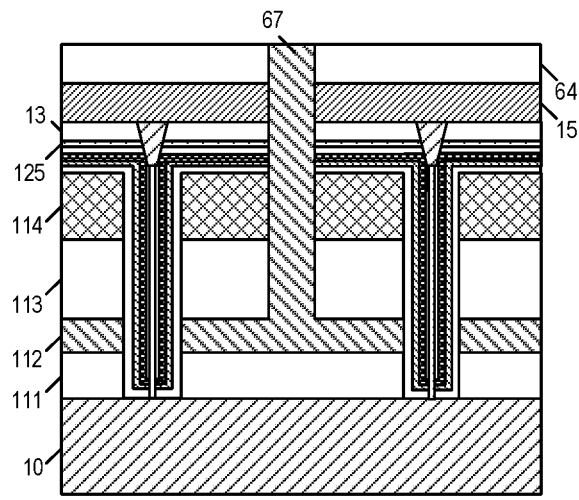

In some embodiments, the forming a first gate layer 112 specifically includes:
  etching the stacked layer to form a plurality of separation slots 66 that are arranged in parallel along the second direction and penetrate to a top surface of the first interlayer isolation layer 111, where each of the plurality of separation slots 66 is located between two adjacent ones of the plurality of through holes 61 arranged in parallel along the second direction to divide the second gate layer 114 into a plurality of second gate structures 41 arranged in parallel along the second direction, as shown in FIG. 7L and FIG. 4;
  removing the sacrificial layer 60 along the separation slot 66 to form a gap region 65, as shown in FIG. 6M and FIG. 7M; and
  filling the conductive material in the gap region 65 along the separation slot 66 to form the first gate layer 112, as shown in FIG. 6N and FIG. 7N.

Figure 7O:
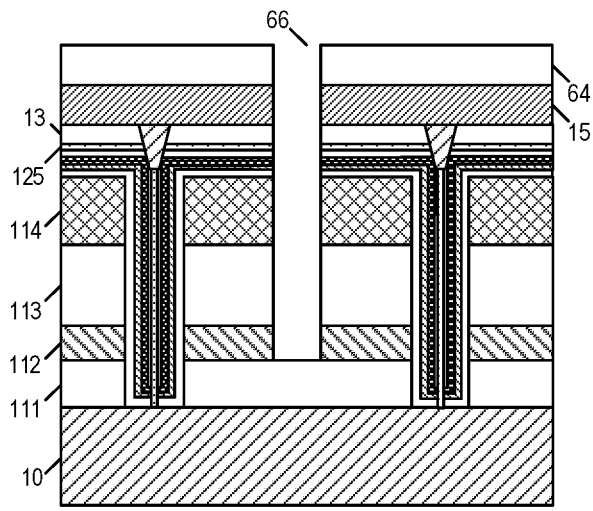

In some embodiments, the manufacturing method of a memory device further includes:

removing the conductive material in the separation slot 66, as shown in FIG. 7O; and filling the insulating material in the separation slot 66 to form a separation structure 16, where the separation structure 16 separates the first gate layer 112 into a plurality of first gate structures 40 arranged in parallel along the second direction.

Figure 6O:
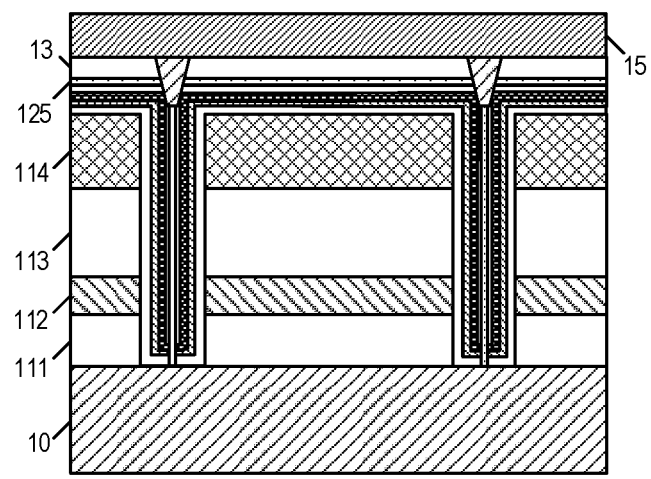

Specifically, after the drain 14 is formed, a second coating layer 15 covering the first coating layer 13 and the drain 14, and a patterned second mask layer 64 located above the second coating layer 15 are formed. The second mask layer 64 has a second etching hole. The first coating layer 13, the trench structure on the stacked layer, and the trench structure partially located in the through hole 61 are etched along the second etching hole to form the plurality of separation slots 66 that are arranged in parallel along the second direction and penetrate to the top surface of the first interlayer isolation layer 111, where each of the plurality of separation slots 66 is located between the two adjacent ones of the plurality of through holes 61 arranged in parallel along the second direction to divide the second gate layer 114 into the plurality of second gate structures 41 arranged in parallel along the second direction, as shown in FIG. 6L, FIG. 7L, and FIG. 4. Next, the sacrificial layer 60 is removed through wet etching long the separation slot 66 to form the gap region 65, as shown in FIG. 6M and FIG. 7M. After that, the conductive material is filled in the gap region 65 along the separation slot 66 to form the first gate layer 112 that fills up the gap region 65 and a filling structure 67 that fills up the separation slot 66, as shown in FIG. 6N and FIG. 7N. The filling structure 67 in the separation slot 66 is etched back to completely remove the filling structure 67, such that the separation slot 66 is used to divide the first gate layer 112 into the plurality of first gate structures 40 arranged in parallel along the second direction, as shown in FIG. 6O, FIG. 7O, and FIG. 4. Finally, the insulating material is filled in the separation slot 66 to form the separation structure 16, as shown in FIG. 6P and FIG. 7P.

In some embodiments, the material of the first gate layer 112 is a metallic material, and the material of the second gate layer 114 is the polycrystalline silicon material.

According to some other embodiments, the specific implementations further provide a driving method of the memory device described above. FIG. 8 is a flowchart of the driving method of the memory device according to a specific implementation of the present disclosure. For schematic structural diagrams of the memory device driven in this specific implementation, reference may be made to FIG. 1A, FIG. 1B, and FIG. 2 to FIG. 4. The memory device driven by the driving method in this specific implementation can be formed by using a memory device forming methods shown in FIG. 5, FIG. 6A to FIG. 6P, and FIG. 7A to FIG. 7P. As shown in FIG. 1A to FIG. 1B, FIG. 4, and FIG. 8, the driving method of the memory device includes the following steps:

Step S91: In a first storage mode, apply a first turn-on voltage to the second gate layer 114 and a first storage voltage to the first gate layer 112 to write information into the ferroelectric layer 123.

Step S92: In a second storage mode, apply a second turn-on voltage to the second gate layer 114 and a second storage voltage to the first gate layer 112 to write information into the charge capture layer 122.

For example, in the first storage mode, the memory device is used as an FeRAM that is a nonvolatile memory. In this case, during a write operation, after the first turn-on voltage is applied to the second gate layer 114, the first storage voltage is applied to the first gate layer 112 to polarize the ferroelectric layer 123. After the polarization, a charge is generated on the surface of the ferroelectric layer 123, so as to write the information. In the second storage mode, the memory device is used as an NAND that is a nonvolatile memory. In this case, during the write operation, after the second turn-on voltage is applied to the second gate layer 114, the second storage voltage greater than the first storage voltage is applied to the first gate layer 112, such that an electron or a hole enters the charge capture layer 122 after passing through the tunneling layer 121 and is stored in the charge capture layer 122. The electron stored in the charge capture layer 122 enables the polarization of the ferroelectric layer 123 to be preserved for a long time, so as to realize a nonvolatile storage function of the memory device. The second storage voltage is greater the first storage voltage.

In some embodiments, the driving method of the memory device further includes the following steps:

in the first storage mode, applying a first reading voltage to the first gate layer 112 to read information stored in the ferroelectric layer 123; and in the second storage mode, applying a second reading voltage to the first gate layer 112 to read information in the charge capture layer 122.

For example, in the first storage mode, the memory device is used as the FeRAM. In this case, during a read operation, a turn-on voltage of the trench structure where the ferroelectric layer 123 is polarized decreases. In this case, the first reading voltage is applied to the first gate layer 112, such that an S/D circuit corresponding to the trench structure is turned on and a number 1 is read. For the trench structure where the ferroelectric layer 123 is not polarized, the first reading voltage is applied to the first gate layer 112, such that the S/D circuit corresponding to the trench structure is turned off and a number 0 is read. In the second storage mode, the memory device is used as the NAND. In this case, during the read operation, the turn-on voltage of the trench structure where the ferroelectric layer 123 is polarized decreases. In this case, the second reading voltage is applied to the first gate layer 112, such that the S/D circuit corresponding to the trench structure is turned on and the number 1 is read. For the trench structure where the ferroelectric layer 123 is not polarized, the second reading voltage is applied to the first gate layer 112, such that the S/D circuit corresponding to the trench structure is turned off and the number 0 is read.

In some embodiments, the driving method of the memory device further includes the following steps:

in the first storage mode, applying a first erasing voltage to the first gate layer 112 to erase the information stored in the ferroelectric layer 123; and in the second storage mode, applying a second erasing voltage to the first gate layer 112 to read the information stored in the charge capture layer 122.

For example, in the first storage mode, the memory device is used as the FeRAM. In this case, during an erasing operation, the first erasing voltage is applied to the first gate layer 112 to perform depolarization by using a measured ferroelectric hysteresis loop of the ferroelectric layer 123, so as to erase information stored in the memory device. In the second storage mode, the memory device is used as the NAND. In this case, during the erasing operation, the second erasing voltage is applied to the first gate layer 112 to perform depolarization by using the measured ferroelectric hysteresis loop of the ferroelectric layer 123, so as to erase the information stored in the memory device.

According to the memory device, and the manufacturing method and the driving method thereof provided in some embodiments of the specific implementations, the stacked structure that includes the first gate layer and the second gate layer and is located between the first gate layer and the second gate layer and between the first gate layer and the substrate is disposed, and the through hole penetrating through the stacked structure and the memory structure filled in the trench structure in the through hole are disposed in the stacked structure. In this way, the memory device can be used as nonvolatile memory with different storage modes, thereby realizing versatility of the memory device and expanding an application field of the memory device.

The above described are merely preferred implementations of the present disclosure. It should be noted that several improvements and modifications may further be made by a person of ordinary skill in the art without departing from the principle of the present disclosure, and such improvements and modifications should also be deemed as falling within the protection scope of the present disclosure.

The invention claimed is:

1. A memory device, comprising:
   a substrate;
   a stacked structure, wherein the stacked structure comprises a first gate layer, a second gate layer, and interlayer isolation layers, one of the interlayer isolation layers is located between the first gate layer and the second gate layer, and another one of the interlayer isolation layers is located between the first gate layer and the substrate; and
   a memory structure, comprising a through hole penetrating through the stacked structure, and a trench structure filled in the through hole;
   wherein the trench structure comprises a tunneling layer covering an inner wall of the through hole, a charge capture layer covering a surface of the tunneling layer, a ferroelectric layer covering a surface of the charge capture layer, an insulating buffer layer covering a surface of the ferroelectric layer, and a channel layer covering a surface of the insulating buffer layer;
   the channel layer penetrates through the tunneling layer, the charge capture layer, the ferroelectric layer, and the insulating buffer layer, which are at a bottom of the through hole; and a bottom surface of the channel layer comes into contact with the substrate; and
   the memory device further comprises:
   a drain, wherein the drain is connected to a top surface of the channel layer in a contact manner;
   wherein the trench structure further covers a top surface of the stacked structure, and the drain penetrates through the trench structure located on the top surface of the stacked structure.

2. The memory device according to claim 1, wherein there are a plurality of memory structures, and the plurality of memory structures are arranged in an array along a first direction and a second direction.

3. The memory device according to claim 2, wherein the first gate layer comprises a plurality of first gate structures that are parallel spaced along the second direction, the second gate layer comprises a plurality of second gate structures that are parallel spaced along the second direction, the plurality of second gate structures are located above the plurality of first gate structures; and a plurality of memory structures, that are arranged in parallel along the first direction, share the plurality of first gate structures and the plurality of second gate structures.

4. The memory device according to claim 3, further comprising:
   a separation structure, wherein the separation structure penetrates through the stacked structure along a direction perpendicular to a top surface of the substrate, and the separation structure is located between two adjacent ones of the plurality of first gate structures and between two adjacent ones of the plurality of second gate structures.

5. The memory device according to claim 3, wherein a material of the plurality of first gate structures is a metallic material, and a material of the plurality of second gate structures is a polycrystalline silicon material.

6. A driving method of the memory device according to claim 1, comprising:
   in a first storage mode, applying a first turn-on voltage to the second gate layer and applying a first storage voltage to the first gate layer, to write information into a ferroelectric layer; and
   in a second storage mode, applying a second turn-on voltage to the second gate layer and applying a second storage voltage to the first gate layer, to write information into a charge capture layer.

7. The driving method of the memory device according to claim 6, further comprising:
   in the first storage mode, applying a first reading voltage to the first gate layer to read information stored in the ferroelectric layer; and
   in the second storage mode, applying a second reading voltage to the first gate layer to read information in the charge capture layer.

8. The driving method of the memory device according to claim 6, further comprising:
   in the first storage mode, applying a first erasing voltage to the first gate layer to erase the information stored in the ferroelectric layer; and
   in the second storage mode, applying a second erasing voltage to the first gate layer to erase the information stored in the charge capture layer.

9. A manufacturing method of a memory device, comprising:
   providing a substrate;
   forming a stacked layer, wherein the stacked layer comprises a first interlayer isolation layer, a sacrificial layer, a second interlayer isolation layer, and a second gate layer that are successively stacked on the substrate;
   etching the stacked layer to form a through hole penetrating through the stacked layer;
   forming a trench structure in the through hole; and
   removing the sacrificial layer and replacing the sacrificial layer with a conductive material to form a first gate layer;
   wherein the forming a trench structure in the through hole comprises:
   forming a tunneling layer on an inner wall of the through hole and on a top surface of the stacked layer;
   forming a charge capture layer on a surface of the tunneling layer;
   forming a ferroelectric layer on a surface of the charge capture layer;
   forming an insulating buffer layer on a surface of the ferroelectric layer;
   etching the insulating buffer layer, the ferroelectric layer, the charge capture layer, and the tunneling layer, which are at a bottom of the through hole, to form a penetrating hole exposing the substrate; and forming a channel layer that fills up the penetrating hole and covers a surface of the insulating buffer layer;

wherein the manufacturing method further comprises:

etching at least a part of the trench structure on the top surface of the stacked layer to form a drain hole exposing the channel layer in the through hole; and filling the drain hole to form a drain.

10. The manufacturing method of a memory device according to claim 9, wherein the forming a through hole penetrating through the stacked layer specifically comprises:

etching the stacked layer to form a plurality of through holes penetrating through the stacked layer, wherein the plurality of through holes are arranged in an array along a first direction and a second direction, the first direction and the second direction are parallel to a top surface of the substrate, and the first direction intersects with the second direction.

11. The manufacturing method of a memory device according to claim 9, wherein the forming a first gate layer specifically comprises:

etching the stacked layer to form a plurality of separation slots that are arranged in parallel along a second direction and penetrate to a top surface of the first interlayer isolation layer; wherein each of the plurality of separation slots is located between two adjacent through holes arranged in parallel along the second direction, to divide the second gate layer into a plurality of second gate structures arranged in parallel along the second direction;

removing the sacrificial layer along the separation slots to form a gap region; and filling the conductive material in the gap region along the separation slots to form the first gate layer.

12. The manufacturing method of a memory device according to claim 11, further comprising:

removing the conductive material in the separation slots; and filling an insulating material in the separation slots to form a separation structure, wherein the separation structure separates the first gate layer into a plurality of first gate structures arranged in parallel along the second direction.

13. The manufacturing method of a memory device according to claim 9, wherein a material of the first gate layer is a metallic material, and a material of the second gate layer is a polycrystalline silicon material.

* * * * *